US012288664B2

(12) United States Patent
Preikszas et al.

(10) Patent No.: US 12,288,664 B2
(45) Date of Patent: Apr. 29, 2025

(54) PARTICLE BEAM DEVICE HAVING A DEFLECTION UNIT

(71) Applicant: Carl Zeiss Microscopy GmbH, Jena (DE)

(72) Inventors: Dirk Preikszas, Oberkochen (DE); Michael W. Phaneuf, Ottawa (CA)

(73) Assignee: Carl Zeiss Microscopy GmbH, Jena (DE)

(*) Notice: Subject to any disclaimer, the term of this patent is extended or adjusted under 35 U.S.C. 154(b) by 456 days.

(21) Appl. No.: 17/695,879

(22) Filed: Mar. 16, 2022

(65) Prior Publication Data
US 2022/0367142 A1 Nov. 17, 2022

(30) Foreign Application Priority Data
May 12, 2021 (DE) .......................... 102021112503.0

(51) Int. Cl.
*H01J 37/147* (2006.01)
*H01J 37/08* (2006.01)
(Continued)

(52) U.S. Cl.
CPC .......... *H01J 37/1472* (2013.01); *H01J 37/08* (2013.01); *H01J 37/09* (2013.01); *H01J 37/10* (2013.01);
(Continued)

(58) Field of Classification Search
CPC ........ H01J 37/1472; H01J 37/08; H01J 37/09; H01J 37/10; H01J 37/244;
(Continued)

(56) References Cited

U.S. PATENT DOCUMENTS 5,008,537 A * 4/1991 Toita ....................... H01J 27/26
250/397
6,586,733 B1 7/2003 Veneklasen et al.
(Continued)

FOREIGN PATENT DOCUMENTS

CN 101379584 A 3/2009
CN 101996839 A 3/2011
(Continued)

OTHER PUBLICATIONS

Chinese Office Action and Search Report, Dated May 17, 2024.
Chinese Office Action, Dated Nov. 29, 2024.

*Primary Examiner* — David A Vanore
(74) *Attorney, Agent, or Firm* — Muirhead and Saturnelli, LLC

(57) ABSTRACT

The invention relates to a particle beam device (100) for imaging, analyzing and/or processing an object (114). The particle beam device (100) comprises a first particle beam generator (300) for generating a first particle beam, wherein the first particle beam generator (300) has a first generator beam axis (301), wherein an optical axis (OA) of the particle beam device (100) and the first generator beam axis (301) are identical; a second particle beam generator (400) for generating a second particle beam, wherein the second particle beam generator (400) has a second generator beam axis (401), wherein the optical axis (OA) and the second generator beam axis (401) are arranged at an angle being different from 0° and 180°; a deflection unit (500) for deflecting the second particle beam from the second generator beam axis (401) to the optical axis (OA) and along the optical axis (OA), wherein the deflection unit (500) has a first opening (501) and a second opening (502) being different from the first opening (501), wherein the optical axis (OA) runs through the first opening (501), wherein the second generator beam axis (401) runs through the second (Continued)

opening (502); an objective lens (107) for focusing the first particle beam or the second particle beam onto the object (114), wherein the optical axis (OA) runs through the objective lens (107); and at least one detector (116, 121, 122) for detecting interaction particles and/or interaction radiation.

15 Claims, 8 Drawing Sheets

(51) Int. Cl.
*H01J 37/09* (2006.01)
*H01J 37/10* (2006.01)
*H01J 37/244* (2006.01)

(52) U.S. Cl.
CPC ..... *H01J 37/244* (2013.01); *H01J 2237/0451* (2013.01); *H01J 2237/06341* (2013.01); *H01J 2237/103* (2013.01); *H01J 2237/151* (2013.01); *H01J 2237/152* (2013.01)

(58) Field of Classification Search
CPC ..... H01J 2237/0451; H01J 2237/06341; H01J 2237/103; H01J 2237/151; H01J 2237/152; H01J 2237/055; H01J 2237/0805; H01J 2237/0822; H01J 2237/24564; H01J 2237/31749; H01J 37/28; H01J 37/147; H01J 37/21; H01J 37/26

See application file for complete search history.

(56) References Cited

U.S. PATENT DOCUMENTS

| | | | |
|---|---|---|---|
| 7,022,987 B2 | 4/2006 | Preikszas et al. | |
| 7,947,951 B2* | 5/2011 | Khursheed | H01J 37/28 |
| | | | 250/493.1 |
| 8,729,466 B1 | 5/2014 | Mankos | |
| 9,620,331 B1 | 4/2017 | Bhattiprolu et al. | |
| 9,911,573 B2* | 3/2018 | Boguslavsky | H01J 37/20 |
| 10,483,084 B2* | 11/2019 | Biberger | G01N 23/2254 |
| 2002/0180961 A1* | 12/2002 | Wack | G01N 21/9501 |
| | | | 356/600 |
| 2003/0098414 A1 | 5/2003 | Uhlemann et al. | |
| 2004/0000642 A1 | 1/2004 | Veneklasen et al. | |
| 2004/0036031 A1* | 2/2004 | Rose | H01J 37/153 |
| | | | 250/396 R |
| 2004/0108458 A1* | 6/2004 | Gerlach | H01J 37/28 |
| | | | 250/311 |
| 2004/0251427 A1* | 12/2004 | Suzuki | H01J 37/20 |
| | | | 250/311 |
| 2006/0065854 A1* | 3/2006 | Shichi | H01J 37/3056 |
| | | | 250/492.21 |
| 2006/0091321 A1* | 5/2006 | Kaga | G01N 23/225 |
| | | | 250/491.1 |
| 2006/0097166 A1* | 5/2006 | Ishitani | H01J 37/28 |
| | | | 250/492.21 |
| 2010/0044566 A1* | 2/2010 | Donitz | B08B 7/0035 |
| | | | 250/311 |
| 2010/0176296 A1* | 7/2010 | Kaito | H01J 37/3056 |
| | | | 250/307 |
| 2010/0301211 A1* | 12/2010 | Miller | H01J 37/09 |
| | | | 250/307 |
| 2011/0049361 A1 | 3/2011 | Preikszas et al. | |
| 2011/0215242 A1* | 9/2011 | Preikszas | H01J 37/145 |
| | | | 250/307 |
| 2014/0124666 A1* | 5/2014 | Sasaki | H01J 37/244 |
| | | | 250/310 |
| 2015/0170876 A1* | 6/2015 | Janssen | H01J 37/28 |
| | | | 250/311 |
| 2015/0206732 A1* | 7/2015 | Sakai | H01J 49/165 |
| | | | 250/288 |
| 2015/0255248 A1* | 9/2015 | Boguslavsky | H01J 37/20 |
| | | | 204/298.36 |
| 2016/0133434 A1* | 5/2016 | Kuramoto | G06V 10/751 |
| | | | 250/306 |
| 2016/0314931 A1* | 10/2016 | Fichter | H01J 37/241 |
| 2018/0025888 A1* | 1/2018 | Shichi | H01J 37/241 |
| | | | 250/307 |
| 2020/0211818 A1 | 7/2020 | Yin et al. | |
| 2020/0388463 A1* | 12/2020 | Schmaunz | H01J 37/147 |
| 2021/0005423 A1 | 1/2021 | Zeidler | |
| 2021/0118661 A1* | 4/2021 | Corkum | H01J 49/067 |
| 2022/0367142 A1* | 11/2022 | Preikszas | H01J 37/28 |

FOREIGN PATENT DOCUMENTS

| | | |
|---|---|---|
| CN | 107301940 A | 10/2017 |
| CN | 112055886 A | 12/2020 |
| CN | 112666198 A | 4/2021 |
| DE | 196 50 680 A1 | 6/1998 |
| EP | 1 388 882 A2 | 2/2004 |
| WO | WO 01/82330 A1 | 11/2001 |
| WO | WO 01/88514 A1 | 11/2001 |

\* cited by examiner

PARTICLE BEAM DEVICE HAVING A DEFLECTION UNIT

TECHNICAL FIELD

The system described herein relates to a particle beam device for imaging, analyzing and/or processing an object and more particularly to a particle beam device having a deflection unit and being an ion beam device and/or an electron beam device.

BACKGROUND

Electron beam devices, in particular a scanning electron microscope (also referred to as SEM below) and/or a transmission electron microscope (also referred to as TEM below), are used to examine objects (also referred to as samples) in order to obtain knowledge with respect to the properties and behavior of the objects under certain conditions.

In an SEM, an electron beam (also referred to as primary electron beam below) is generated by means of a beam generator and is focused on an object to be examined by means of a beam guiding system. An objective lens is used for focusing purposes. The primary electron beam is guided over a surface of the object to be examined by means of a deflection device. This is also referred to as scanning. The area scanned by the primary electron beam is also referred to as scanning region. During scanning, the electrons of the primary electron beam interact with the object to be examined. Interaction particles and/or interaction radiation result as a consequence of the interaction. By way of example, the interaction particles are electrons. In particular, electrons are emitted by the object—the so-called secondary electrons—and electrons of the primary electron beam are scattered back at the object—the so-called backscattered electrons. The interaction particles form the so-called secondary particle beam and are detected by at least one particle detector. The particle detector generates detection signals which are used to generate an image of the object. An image of the object to be examined is thus obtained. By way of example, the interaction radiation is X-ray radiation or cathodoluminescence light. At least one radiation detector is used to detect the interaction radiation.

In the case of a TEM, a primary electron beam is likewise generated by means of a beam generator and directed onto an object to be examined by means of a beam guiding system. The primary electron beam passes through the object to be examined. When the primary electron beam passes through the object to be examined, the electrons of the primary electron beam interact with the material of the object to be examined. The electrons passing through the object to be examined are imaged onto a luminescent screen or onto a detector—for example in the form of a camera—by a system comprising an objective. By way of example, the aforementioned system additionally also comprises a projection lens. Imaging may also take place in the scanning mode of a TEM. Such a TEM is referred to as STEM. Additionally, provision may be made for detecting electrons scattered back at the object to be examined and/or secondary electrons emitted by the object to be examined, by means of at least one further detector in order to image the object to be examined.

Combining the functions of an STEM and an SEM in a single particle beam device is known. It is therefore possible to carry out examinations of objects with an SEM function and/or with an STEM function using this particle beam device.

Moreover, a particle beam device in the form of an ion beam column is known. Ions used for processing an object are generated using an ion beam generator arranged in the ion beam column. By way of example, material of the object is ablated or material is applied onto the object during the processing, wherein a gas may be used. The ions are additionally or alternatively used for imaging.

Furthermore, the prior art has disclosed the practice of analyzing and/or processing an object in a particle beam device using, on one hand, electrons and, on the other hand, ions. By way of example, an electron beam column having the function of an SEM is arranged at the particle beam device. Additionally, an ion beam column, which is explained above, is arranged at the particle beam device. The electron beam column with the SEM function serves, in particular, for examining further the processed or unprocessed object, but also for processing the object.

A particle beam generator in the form of an electron gun is known from the prior art. For example, the electron gun is a thermionic source which emits electrons when heated. Alternatively, the electron gun may be a field emission source which emits electrons when an intense electric field is applied to it.

A thermionic source uses, for example, a tungsten filament, a pointed emitter of a single crystal or a sintered compound of lanthanum hexaboride ($LaB_6$) or cerium hexaboride ($CeB_6$). If those materials are heated to a sufficiently high temperature, the electrons of the materials receive sufficient energy to overcome the natural barrier (work function). Therefore, the thermionic source emits thermally excited electrons, thereby generating an electron beam. The design of a thermionic source may vary. It is known to use a thermionic source comprising a tip, for example a tip of a tungsten filament or a $LaB_6$ crystal comprising such a tip. Furthermore, it is also known to use a $LaB_6$ crystal in the form of a truncated cone with a polished circular disk. This disk is an electron emission surface.

A field emission source operates according to a different principle than thermionic sources. The principle behind field emission is that the strength of an electric field is considerably increased at sharp points. If the electric field is strong enough, the work function barrier is sufficiently lowered for electrons to tunnel out of the material due to the tunnelling effect or the Schottky effect. There are two types of field emission sources, namely a cold field emission source and a thermal field emission source. In the case of a cold field emission source, the end of an electron source is normally made from a single crystal fine tungsten wire and is subjected to a strong electric field at room temperature whereby electrons in the single crystal are emitted using a tunnelling effect, so that an electron beam is generated. However, to allow field emission, the surface must be free of contaminants and oxides. This can be achieved by operating the system under relatively good vacuum conditions (for example, the residual pressure being lower than $10^{-7}$ hPa), in particular under UHV conditions (ultra-high vacuum conditions). In the case of a thermal field emission source, the electron source is heated while being subjected to a strong electric field which causes electrons to be emitted using the Schottky effect, so that an electron beam is generated. The required vacuum conditions for such an electron source are more relaxed, but still require a residual pressure lower than $10^{-6}$ hPa.

A further particle beam generator in the form of an ion beam generator is also known from the prior art. The ion beam generator comprises an ion source configured to emit ions, a suppressor electrode configured to suppress the emitted ions from a side surface of the ion source, an extractor electrode configured to extract the ions from the ion source, a first variable voltage supply unit for biasing the extractor electrode with an extractor voltage and a second variable voltage supply unit for biasing the suppressor electrode with a suppressor voltage. The particle beam generator provides an emission current comprising the ions.

It is known to use a liquid metal ion source as the ion source. The liquid metal ion source has a container comprising liquid metal, for example gallium. An emission device in the form of an emission wire having a tip is arranged at the container. The liquid metal flows from the container along a surface of the emission wire to the tip of the emission wire. Due to the arrangement of the ion source described above, the tip of the emission wire is exposed to an electric field sufficient to ionize atoms of the liquid metal and to extract them from the tip of the emission wire. Thereby, an ion beam comprising ions is generated.

If liquid gallium is used as the metal for the liquid metal ion source, gallium ions might be implanted into the surface of the object. Moreover, when using a gallium liquid metal ion source, the penetration depth of the gallium ions into the object is a few nm, for example 5 nm to 8 nm. The implantation of gallium ions may alter the chemical structure of the object, which is often undesirable. It is also known to use a plasma ion source as an ion particle beam generator, wherein a noble gas such as argon is used for generating ions. Using such plasma ion source reduces or avoids the implantation of ions into the object. It is also known to use, in a first step, a gallium liquid metal ion source for generating ions for milling an object and, in a second step, to use a plasma ion source for generating ions to remove a layer of the material of the object, wherein the layer has a thickness of 5 nm to 8 nm, thereby removing gallium ions having been implanted into the object during milling.

A particle beam device is known comprising both, a liquid metal ion source and a plasma ion source. In particular, the particle beam device comprises a first particle beam column having the liquid metal ion source and a second particle beam column having the plasma ion source, wherein the first particle beam column and the second particle beam column are arranged at an object chamber of the particle beam device. The object is moved to a first position in the object chamber if ions generated by the liquid metal ion source are guided to the object. Furthermore, the object is moved to a second position in the object chamber if ions generated by the plasma ion source are guided to the object. The object chamber has a sufficient size so that the first particle beam column and the second particle beam column may be arranged at the object chamber. However, if a smaller object chamber should be used, there is no sufficient space available at the object chamber for arranging the first particle beam column and the second particle beam column at the object chamber.

General prior art in this area is provided by DE 196 50 680 A1 and WO 01/82330 A1.

Therefore, it is desirable for providing a particle beam device having a first particle beam generator for generating a first particle beam having first charged particles and a second particle beam generator for generating a second particle beam having second charged particles, wherein the particle beam device also comprises means for selecting the first charged particles or the second charged particles.

SUMMARY OF THE INVENTION

Features of the system described herein are evident from the following description, the following claims and/or the accompanying figures.

The particle beam device according to the system described herein is used for imaging, analyzing and/or processing an object. The aforementioned particle beam device may be an electron beam device and/or an ion beam device. The particle beam device may include an optical axis along which a first particle beam or a second particle beam of the particle beam device may be guided.

The particle beam device according to the system described herein may include a first particle beam generator for generating the first particle beam having first charged particles. The first charged particles may be electrons or ions. The first particle beam generator has a first generator beam axis. The optical axis and the first generator beam axis are identical. In particular, the optical axis and the first generator beam axis may follow a straight line.

Additionally, the particle beam device according to the system described herein may include a second particle beam generator for generating the second particle beam having second charged particles. The second charged particles may be electrons or ions. The second particle beam generator may have a second generator beam axis. The optical axis and the second generator beam axis may be arranged at an angle being different from 0° and 180°. In other words, the optical axis and the second generator beam axis may be arranged at an angle to each other and are not identical.

The particle beam device according to the system described herein may also include a deflection unit for deflecting the second charged particles of the second particle beam from the second generator beam axis to the optical axis and further along the optical axis. The deflection unit may include a first opening and a second opening being different from the first opening. The optical axis runs through the first opening, whereas the second generator beam axis runs through the second opening. The particle beam device according to the system described herein may be configured in such a way that the first charged particles of the first particle beam are not deflected by the deflection unit if the first charged particles of the first particle beam are guided along the optical axis. Accordingly, the deflection unit may have two operation modes, namely a first operation mode and a second operation mode. In the first operation mode, the first charged particles of the first particle beam are guided along the optical axis and are not deflected by the deflection unit. In the second operation mode, the second charged particles of the second particle beam are deflected by the deflection unit from the second generator beam axis to the optical axis and are guided further along the optical axis.

The particle beam device according to the system described herein may also include an objective lens for focusing the first particle beam or the second particle beam onto the object. Moreover, the particle beam device according to the system described herein may have at least one detector for detecting interaction particles and/or interaction radiation, the interaction particles and the interaction radiation being generated when the first particle beam or the second particle beam impinges on the object. The interaction particles may be secondary particles and/or backscattered particles, in particular secondary electrons and backscattered electrons or backscattered ions. The interaction radiation may be X-rays and/or cathodoluminescence light.

The particle beam device according to the system described herein provides for selecting the first particle beam having the first charged particles or the second particle beam having the second charged particles. Moreover, the particle beam device according to the system described herein provides for deflecting the second particle beam having the second charged particles from the second generator beam axis to the optical axis and along the optical axis for guiding the second particle beam to the objective lens. Additionally, the particle beam device according to the system described herein is configured to focus the second particle beam having the second charged particles in a plane of deflection which is identical to focusing the second particle beam in a further plane at each point of the optical axis, wherein the further plane is perpendicular to the plane of deflection. Therefore, a stigmatic imaging of the object may be provided. Additionally, the particle beam device according to the system described herein provides for the first particle beam to pass the deflection unit if the first particle beam is selected, wherein the first particle beam is not deflected by the deflection unit.

An embodiment of the particle beam device according to the system described herein additionally or alternatively provides that the first particle beam generator is a liquid metal ion source. In particular, the first particle beam generator may be a gallium liquid metal ion source. The invention is not restricted to gallium as a metal. Rather, any metal may be chosen which is suitable for the invention. A further embodiment of the particle beam device according to the system described herein additionally or alternatively provides that the second particle beam generator is a plasma ion source. In particular, the second particle beam generator may be a noble gas plasma ion source, for example an argon plasma ion source. The invention is not restricted to argon as a noble gas. Rather, any noble gas may be chosen which is suitable for the invention.

Another embodiment of the particle beam device according to the system described herein additionally or alternatively provides that the first particle beam generator may be a cold field emission source and that the second particle beam generator may be a thermionic source. For example, the first particle beam generator may be a first electron source and/or the second particle beam generator may be a second electron source. Additionally or alternatively, the particle beam device according to the system described herein provides that the first particle beam generator may be an electron source and that the second particle beam generator may be an ion source. In a further embodiment, the particle beam device according to the system described herein provides that the first particle beam generator may be an ion source and that the second particle beam generator may be an electron source. A further embodiment of the particle beam device according to the system described herein additionally or alternatively provides that the first particle beam generator is a first ion source and that the second particle beam generator is a second ion source.

An embodiment of the particle beam device according to the system described herein additionally or alternatively provides a first generator condenser lens extending along the first generator beam axis. Accordingly, the first generator condenser lens extends along the optical axis. Moreover, the first generator condenser lens is arranged between the first particle beam generator and the deflection unit. The first generator condenser lens is configured to focus and to guide the first particle beam along the optical axis. Additionally or alternatively, the particle beam device according to the system described herein provides a second generator condenser lens extending along the second generator beam axis. Accordingly, the second generator condenser lens does not extend along the optical axis. Additionally, the second generator condenser lens is arranged between the second particle beam generator and the deflection unit. The second generator condenser lens is configured to focus and to guide the particle beam along the second generator beam axis. In particular, the second generator condenser lens may generate a crossover of the second particle beam at a center of the deflection unit and on the optical axis. The crossover is a beam waist of the second particle beam, wherein the beam waist is an area having a minimal diameter of the second particle beam.

A further embodiment of the particle beam device according to the system described herein additionally or alternatively provides a beam limiting aperture unit which may be arranged along the optical axis. Moreover, the beam limiting aperture unit may be arranged between the deflection unit and the objective lens. In particular, the beam limiting aperture unit may be configured to select second charged particles of the second particle beam to be guided to the objective lens and to be focused onto the object. The second particle beam may be dispersed after having been deflected by the deflection unit. The dispersion depends on the energy of the second charged particles. The beam limiting aperture unit may have an area illuminated by the second particle beam including second charged particles having any available kinetic energy. Therefore, second charged particles with any available kinetic energy are guided to the objective lens. Accordingly, a dispersion of the second particle beam due to the deflection of the second charged particles having different energies by the deflection unit does not affect the beam quality of the second particle beam entering the objective lens.

Another embodiment of the particle beam device according to the system described herein additionally or alternatively provides a first beam stop unit for stopping the first particle beam. In other words, the particle beam device may include a first beam stop unit which is used for stopping the first particle beam if the second particle beam is deflected by the deflection unit and is guided along the optical axis to the objective lens. The deflection unit may be configured in such a way that, when deflecting the second particle beam from the second generator beam axis to the optical axis, the first particle beam is deflected by the deflection unit to the first beam stop unit for stopping the first particle beam.

An embodiment of the particle beam device according to the system described herein additionally or alternatively provides a first movable beam stop unit for stopping the first particle beam, wherein the first movable beam stop unit may extend along the first generator beam axis. Moreover, the first movable beam stop unit may be arranged between the first particle beam generator and the deflection unit. The first movable beam stop unit of this embodiment may be used for stopping the first particle beam if the second particle beam is deflected by the deflection unit and is guided along the optical axis to the objective lens. In particular, the first movable beam stop unit may be a valve. The valve may be configured to be closed if the first particle beam has to be stopped and may be configured to be opened if the first particle beam is guided along the optical axis to the objective lens.

Another embodiment of the particle beam device according to the system described herein additionally or alternatively provides a second beam stop unit for stopping the second particle beam. In other words, the particle beam device may include a second beam stop unit which is used for stopping the second particle beam if the first particle beam is guided along the optical axis to the objective lens. When the first particle beam is guided along the optical axis, the deflection unit does deflect neither the first particle beam nor the second particle beam. Therefore, the second particle beam is guided along the second generator beam axis to the second beam stop unit for stopping the second particle beam.

An embodiment of the particle beam device according to the system described herein additionally or alternatively provides a second movable beam stop unit for stopping the second particle beam, wherein the second movable beam stop unit may extend along the second generator beam axis. Moreover, the second movable beam stop unit may be arranged between the second particle beam generator and the deflection unit. The second movable beam stop unit of this embodiment may be used for stopping the second particle beam if the first particle beam is guided along the optical axis to the objective lens. In particular, the second movable beam stop unit may be a valve. The valve may be configured to be closed if the second particle beam has to be stopped and may be configured to be opened if the second particle beam is guided from the second generator beam axis to the optical axis as well as along the optical axis in the direction of the objective lens.

A further embodiment of the particle beam device according to the system described herein additionally or alternatively provides that the deflection unit may be a magnetic deflection unit providing a non-homogeneous magnetic field. In particular, the deflection unit may have a first pole piece and a second pole piece arranged opposite the first pole piece. A cone-shaped opening having a half cone angle is arranged between the first pole piece and the second pole piece, wherein the optical axis runs through the cone-shaped opening. The half cone angle may be in the range of 0.5° and 4°, wherein the boundaries are included in the range. The invention is not restricted to the aforementioned range. Rather, any value of the half cone angle may be chosen which is suitable for the invention. The first pole piece and the second pole piece may include a yoke having a coil arranged at the yoke. The cone-shaped opening may provide the non-homogeneous magnetic field which is used for focusing the second particle beam having the second charged particles in the plane of deflection which is identical to focusing the second particle beam in the further plane at each point of the optical axis, wherein the further plane is perpendicular to the plane of deflection. The magnetic field strength B may be given by $$B = \frac{1}{R} \cdot \sqrt{\frac{2 \cdot m \cdot U}{e}}$$

wherein R is a deflection radius, m is the mass of second charged particles of the second particle beam, U is an acceleration voltage of the second charged particles of the second particle beam and e is the elementary charge. For example, when R=50 mm and U=2 kV, the magnetic field strength B=0.81 T if the second charged particles are argon ions. The half cone angle may be given by $$\alpha = \frac{1}{8} \cdot \frac{D}{R}$$

wherein $\alpha$ is the half cone angle and D is a gap between the first pole piece and the second pole piece. For example, when D=10 mm and R=50 mm, the half cone angle $\alpha$ is 1.43° (1/40 radians).

Another embodiment of the particle beam device according to the system described herein additionally or alternatively provides that the deflection unit may be an electrostatic deflection unit providing an electric field. In particular, the electrostatic deflection unit may include a first deflection electrode and a second deflection electrode arranged opposite the first deflection electrode. The electrostatic deflection unit may include a spherical capacitor. Moreover, the electrostatic deflection unit may include an entrance side and an exit side. A first grounded shield tube is arranged at the entrance side between the deflection unit and the second beam generator. A second grounded shield tube is arranged at the exit side between the deflection unit and the objective lens. The first grounded shield tube and the second grounded shield tube are configured to limit a fringing field of the electrostatic deflection unit. A third grounded shield tube configured to limit a fringing field of the electrostatic deflection unit may be arranged at the first opening of the deflection unit between the deflection unit and the first beam generator.

A voltage $U_1$ at the first deflection electrode may be given by $$U_1 = 2 \cdot U \cdot \left(1 - \frac{R}{R_1}\right)$$

wherein $R_1$ is a radius of the first deflection electrode, U is the acceleration voltage of the second charged particles of the second particle beam and R is the deflection radius. Moreover, a voltage $U_2$ at the second deflection electrode may be given by $$U_2 = 2 \cdot U \cdot \left(1 - \frac{R}{R_2}\right)$$

wherein $R_2$ is a radius of the second deflection electrode, U is the acceleration voltage of the second charged particles of the second particle beam and R is the deflection radius. For example, when U=2 kV, R=50 mm, $R_1$=45 mm and $R_2$=55 mm, then $U_1$=−444 V and $U_2$=364 V.

Another embodiment of the particle beam device according to the system described herein additionally or alternatively provides an electrode for compensating the electric field in the electrostatic deflection unit. Since the first opening in the electrostatic deflection unit influences the electric field in the electrostatic deflection unit, a compensation of the electric field is desirable. Therefore, this embodiment of the particle beam device according to the system described herein provides the electrode for compensating the electric field. The electrode may be arranged at the first opening and may be separated from the deflection unit.

An embodiment of the particle beam device according to the system described herein additionally or alternatively provides that the first opening includes a first opening part and a second opening part. The first opening part is connected to the second opening part by a bridge, wherein the bridge is part of the electrostatic deflection unit. Additionally, the first opening part and the second opening part may be symmetrical. The electrode for compensating the electric field may be arranged at the first opening part and/or the second opening part of the first opening. Furthermore, the electrode may be separated from the electrostatic deflection unit. Additionally or alternatively, a first electrode for compensating the electric field may be arranged at the first opening part and a second electrode for compensating the electric field may be arranged at the second opening part. Furthermore, the first electrode for compensating the electric field and/or the second electrode for compensating the electric field may be separated from the electrostatic deflection unit.

A further embodiment of the particle beam device according to the system described herein additionally or alternatively provides at least one deformation of the electrostatic deflection unit for compensating the electric field in the electrostatic deflection unit. For example, the deformation is arranged at an edge or in the vicinity of the edge of the first opening of the electrostatic deflection unit. In particular, the at least one deformation may be arranged up to 10 mm from the edge of the first opening of the electrostatic deflection unit. The invention is not restricted to this embodiment. Rather, the deformation or deformations may be arranged anywhere at the electrostatic deflection unit which is suitable for the invention. Since the first opening in the electrostatic deflection unit influences the electric field in the electrostatic deflection unit, a mechanism for compensating the electric field is desirable. Therefore, this embodiment includes the deformation compensating the electric field. A further embodiment of the particle beam device according to the system described herein additionally or alternatively provides that the first opening includes a first opening part and a second opening part. The first opening part is connected to the second opening part by a bridge, wherein the bridge is part of the electrostatic deflection unit. At least one deformation for compensating the electric field may be arranged at the bridge or in the vicinity of the bridge. In particular, the at least one deformation may be arranged up to 10 mm from the bridge. The invention is not restricted to this embodiment. Rather, the deformation or deformations may be arranged anywhere at the bridge or near the bridge which is suitable for the invention. Additionally, the first opening part and the second opening part may be symmetrical.

An embodiment of the particle beam device according to the system described herein additionally or alternatively provides that the particle beam device is at least one of the following: an electron beam device and an ion beam device.

BRIEF DESCRIPTION OF THE DRAWINGS

Embodiments of the system described herein will be explained in more detail in the following text with reference to the figures, in which.

DETAILED DESCRIPTION OF VARIOUS EMBODIMENTS

Figure 1:
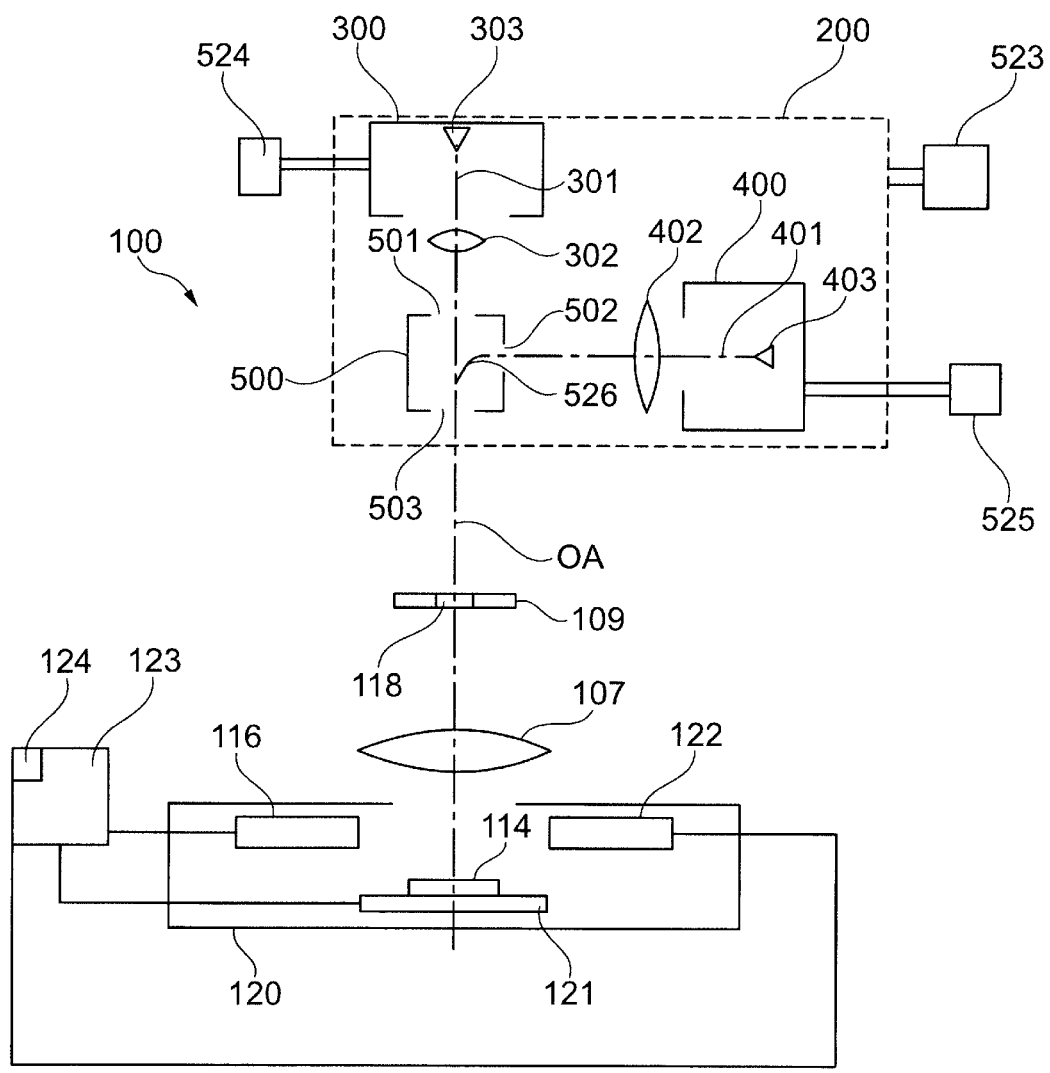
FIG. 1 shows a schematic representation of an embodiment of a particle beam device.

FIG. 1 shows a schematic representation of a particle beam device 100. The particle beam device 100 has a particle generator unit 200 which may include a housing. The particle generator unit 200 is arranged at a beam guide tube (not shown in FIG. 1).

The particle generator unit 200 includes a first particle beam generator 300 for generating a first particle beam having first charged particles. The first charged particles may be electrons or ions. For example, the first particle beam generator 300 includes a first charged particle source 303 in the form of a liquid metal ion source. In particular, the first charged particle source 303 may be a gallium liquid metal ion source. The invention is not restricted to gallium as a metal. Rather, any metal may be chosen which is suitable for the invention. The first particle beam generator 300 has a first generator beam axis 301. An optical axis OA of the particle beam device 100 and the first generator beam axis 301 are identical. In particular, the optical axis OA and the first generator beam axis 301 may follow a straight line. A first generator condenser lens 302 extends along the first generator beam axis 301. Accordingly, the first generator condenser lens 302 extends along the optical axis OA. Moreover, the first generator condenser lens 302 is arranged between the first particle beam generator 300 and a deflection unit 500 which is schematically shown in FIG. 1 and which will be explained in detail further below. The first generator condenser lens 302 is configured to focus and to guide the first particle beam along the optical axis OA.

Furthermore, the particle generator unit 200 includes a second particle beam generator 400 for generating a second particle beam having second charged particles. The second charged particles may be electrons or ions. For example, the second particle beam generator 400 includes a second charged particle source 403 in the form of a noble gas plasma ion source, for example an argon plasma ion source. The invention is not restricted to argon as a noble gas. Rather, any noble gas may be chosen which is suitable for the invention. The second particle beam generator 400 has a second generator beam axis 401. The optical axis OA of the particle beam device 100 and the second generator beam axis 401 are arranged at an angle being different from 0° and 180°. In other words, the optical axis OA and the second generator beam axis 401 are arranged at an angle to each other and are not identical. For example, the optical axis OA and the second generator beam axis 401 are arranged at 90° to each other. The invention is not restricted to an angle of 90°. Rather, any angle may be chosen which is suitable for the invention and which is different from 0° and 180°. A second generator condenser lens 402 extends along the second generator beam axis 401. Accordingly, the second generator condenser lens 402 does not extend along the optical axis OA. Additionally, the second generator condenser lens 402 is arranged between the second particle beam generator 400 and the deflection unit 500. The second generator condenser lens 402 is configured to focus and to guide the second particle beam along the second generator beam axis 401. In particular, the second generator condenser lens 402 may generate a crossover of the second particle beam at a center of the deflection on a curved axis 526. The crossover is a beam waist of the second particle beam, wherein the beam waist is an area having a minimal diameter of the second particle beam.

Another embodiment of the particle beam device 100 according to the system described herein additionally or alternatively provides that the first particle beam generator 300 may be a cold field emission source and that the second particle beam generator 400 may be a thermionic source. For example, the first particle beam generator 300 may be a first electron source and/or the second particle beam generator 400 may be a second electron source. Additionally or alternatively, the particle beam device 100 according to the system described herein provides that the first particle beam generator 300 may be an electron source and that the second particle beam generator 400 may be an ion source. In a further embodiment, the particle beam device 100 according to the system described herein provides that the first particle beam generator 300 may be an ion source and that the second particle beam generator 400 may be an electron source. A further embodiment of the particle beam device 100 according to the system described herein additionally or alternatively provides that the first particle beam generator 300 is a first ion source and that the second particle beam generator 400 is a second ion source.

As mentioned above, the particle generator unit 200 also includes the deflection unit 500 for deflecting the second charged particles of the second particle beam from the second generator beam axis 401 to the optical axis OA and further along the optical axis OA. The deflection unit 500 includes a first opening 501 and a second opening 502 being different from the first opening 501. The optical axis OA runs through the first opening 501, wherein the first opening 501 is arranged at a first side of the deflection unit 500 which first side is directed to the first particle beam generator 300. The second generator beam axis 401 runs through the second opening 502, wherein the second opening 502 is arranged at a second side of the deflection unit 500 which second side is directed to the second particle beam generator 400. The deflection unit 500 also includes a third opening 503 being different to the first opening 501 and being different to the second opening 502. The third opening 503 is opposite to the first opening 501. The optical axis OA also runs through the third opening 503, wherein the third opening 503 is arranged at a third side of the deflection unit 500 which third side is directed to an objective lens 107 of the particle beam device 100.

The particle beam device 100 is configured in such a way that the first charged particles of the first particle beam are not deflected by the deflection unit 500 if the first charged particles of the first particle beam are guided along the optical axis OA. Accordingly, the deflection unit 500 may have two operation modes, namely a first operation mode and a second operation mode. In the first operation mode, the first charged particles of the first particle beam are guided along the optical axis OA and are not deflected by the deflection unit 500. In the second operation mode, the second charged particles of the second particle beam are deflected by the deflection unit 500 from the second generator beam axis 401 to the optical axis OA and are guided further along the optical axis OA.

The first charged particles of the first particle beam or the second charged particles of the second particle beam travel along the optical axis OA through the beam guide tube extending to the objective lens 107 which may be an electrostatic and/or magnetic objective lens.

A stationary aperture unit 109 is arranged between the deflection unit 500 and the objective lens 107. Alternatively, the aperture unit 109 is moveable. In the exemplary embodiment shown here, the aperture unit 109 is a circular aperture having an aperture opening 118 for the first particle beam or second particle beam to pass through, the aperture opening 118 having an extension in the range of 5 µm to 2000 µm, wherein the boundaries are included in this range, for example, 35 µm. The aperture unit 109 may be a pressure stage aperture. The aperture unit 109 of a further exemplary embodiment may have several openings which may be mechanically moved with respect to the first particle beam or the second particle beam, or which may be passed through by the first particle beam or the second particle beam using electrical and/or magnetic deflection devices. As mentioned above, the aperture unit 109 may also be a pressure stage unit that separates a first area, in which the particle generator unit 200 is arranged, having an ultra-high vacuum ($10^{-7}$ to $10^{-12}$ hPa), from a second area with a high vacuum ($10^{-3}$ to $10^{-7}$ hPa). The second area is the intermediate pressure area of the beam guide tube leading to an object chamber 120 via the objective lens 107.

The objective lens 107 may have a magnetic lens, an electrostatic lens, or an electrostatic-magnetic lens. Depending on the type of lens, the objective lens 107 may have pole pieces, in which a bore has been made. The beam guide tube may be arranged and guided through the bore, if the lens has pole pieces. Further, a coil may be arranged in the pole pieces. Depending on the type of lens, the objective lens 107 may have electrodes, in which bores have been made. The beam guide tube may extend to the electrodes, if the lens has electrodes. The electric potential of the beam guide tube may be ground or different from ground. One or more of the electrodes may be on an electric potential other than the beam guide tube potential.

In addition, the particle beam device 100 has a scanning device (not shown in FIG. 1), via which the first particle beam or the second particle beam may be deflected and scanned across an object 114. In this process, the first charged particles of the first particle beam or the second charged particles of the second particle beam interact with the object 114. As a consequence of this interaction, interaction particles and/or interaction radiation will result, which are detected. The detection signals obtained in this manner are evaluated.

As interaction particles, in particular, particles are emitted from the surface of the object 114 (so-called secondary particles) or particles of the first particle beam or the second particle beam are scattered back from the object 114 (so-called backscattered particles). For example, the particles emitted from the surface of the object 114 may be secondary electrons. Moreover, the particles scattered back at the object 114 may be backscattered electrons or ions.

For detecting secondary particles and/or backscattered particles, a first detector 116 is arranged in the object chamber 120 of the particle beam device 100. The first detector 116 is used to detect mostly secondary particles. Particles backscattered from the object 114, i.e., backscattered particles, may also be detected by the first detector 116.

The detection signals generated by the first detector 116 are used to generate an image or images of the surface of the object 114.

In addition to the first detector 116 mentioned above, the particle beam device 100 has a radiation detector 122 which is arranged in the object chamber 120. The radiation detector 122 may be, for example, positioned between the beam guide tube and the object 114. Moreover, the radiation detector 122 may also be positioned at the side of the object 114. The radiation detector 122 may be a CCD detector.

The object chamber 120 is operated in a first pressure range or in a second pressure range, wherein the first pressure range only includes pressures lower than or equal to $10^{-3}$ hPa and wherein the second pressure range only includes pressures over $10^{-3}$ hPa. A pressure sensor (not shown in FIG. 1) is arranged in the object chamber 120 for measuring the pressure in the object chamber 120. A vacuum system (not shown in FIG. 1) in the form of a pump system being connected to the pressure sensor and being arranged at the object chamber 120 provides for the pressure range, either the first pressure range or the second pressure range, in the object chamber 120.

The particle beam device 100 may further have a second detector 121 which is arranged in the object chamber 120. The second detector 121 is arranged downstream of the object 114 viewed from the first particle beam generator 300 in the direction of the object 114 along the optical axis OA. The first particle beam or the second particle beam may be transmitted through the object 114. Particles of the first particle beam or the second particle beam interact with the material of the object 114. Particles transmitted through the object 114 are detected using the second detector 121.

The first detector 116, the second detector 121 and the radiation detector 122 are connected to a control unit 123. The control unit 123 may include a monitor 124 used for showing images generated using detector signals of the first detector 116, the second detector 121 and/or the radiation detector 122.

The particle generator unit 200 is connected to a first pump system 523 for providing a vacuum in the particle generator unit 200. Additionally or alternatively, the first particle beam generator 300 is connected to a second pump system 524 for providing a vacuum in the first particle beam generator 300. Additionally or alternatively, the second particle beam generator 400 is connected to a third pump system 525 for providing a vacuum in the second particle beam generator 400.

Figure 2:
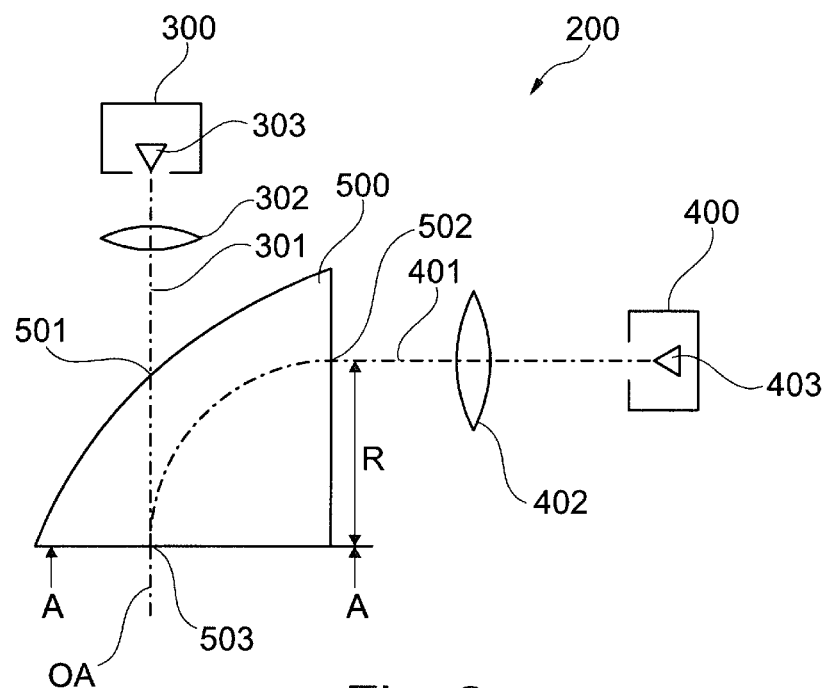
FIG. 2 shows a schematic representation of a first embodiment of a particle generator unit of the particle beam device.
Figure 3:
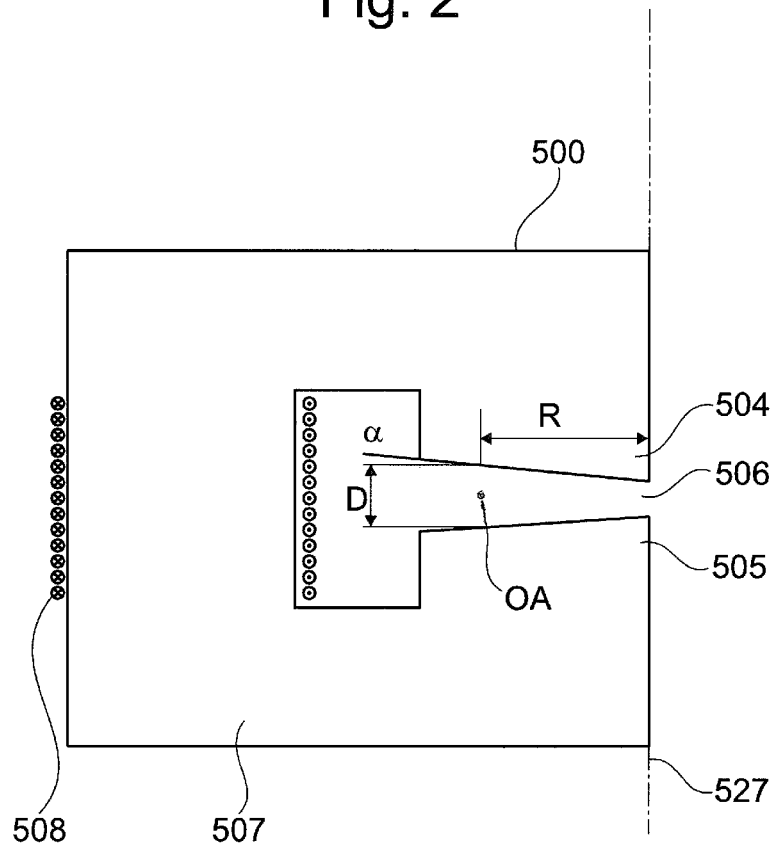
FIG. 3 shows a further schematic representation of the first embodiment of the particle generator unit according to FIG. 2.

FIG. 2 shows a schematic view of the particle generator unit 200 as shown in FIG. 1. The same reference signs denote the same components of the particle generator unit 200. Therefore, the explanations above also apply. FIG. 3 shows a schematic view of the deflection unit 500 in the direction A as shown in FIG. 2. The deflection unit 500 may be a magnetic deflection unit providing a non-homogeneous magnetic field. In particular, the deflection unit 500 may have a first pole piece 504 and a second pole piece 505 arranged opposite the first pole piece 504. A cone-shaped opening 506 having a half cone angle α is arranged between the first pole piece 504 and the second pole piece 505, wherein the optical axis OA runs through the cone-shaped opening 506. In FIG. 3, the right edge of the deflection unit 500 corresponds to the coinciding symmetry axes 527 of the cone-shaped face of the first pole piece 504 and the cone-shaped face of the second pole piece 505. Furthermore, the center of the deflection arc of the second particle beam is positioned on these symmetry axes 527. The half cone angle α of the cone-shaped faces may be in the range of 0.5° and 4°, wherein the boundaries are included in the range. The invention is not restricted to the aforementioned range. Rather, any value of the half cone angle α may be chosen which is suitable for the invention. The first pole piece 504 and the second pole piece 505 may include a yoke 507 having a coil 508 arranged at the yoke 507. The cone-shaped opening 506 may provide the non-homogeneous magnetic field which is used for focusing the second particle beam having the second charged particles in the plane of deflection which is identical to focusing the second particle beam in the further plane at each point of the optical axis OA, wherein the further plane is perpendicular to the plane of deflection. The magnetic field strength B may be given by $$B = \frac{1}{R} \cdot \sqrt{\frac{2 \cdot m \cdot U}{e}}$$

wherein R is a deflection radius, m is the mass of second charged particles of the second particle beam, U is an acceleration voltage of the second charged particles of the second particle beam and e is the elementary charge. For example, when R=50 mm and U=2 kV, the magnetic field strength B=0.81 T if the second charged particles are argon ions. The half cone angle α may be given by $$\alpha = \frac{1}{8} \cdot \frac{D}{R}$$

wherein α is the half cone angle and D is a gap between the first pole piece 504 and the second pole piece 505. For example, when D=10 mm and R=50 mm, the half cone angle α is 1.43° (1/40 radians).

Figure 4:
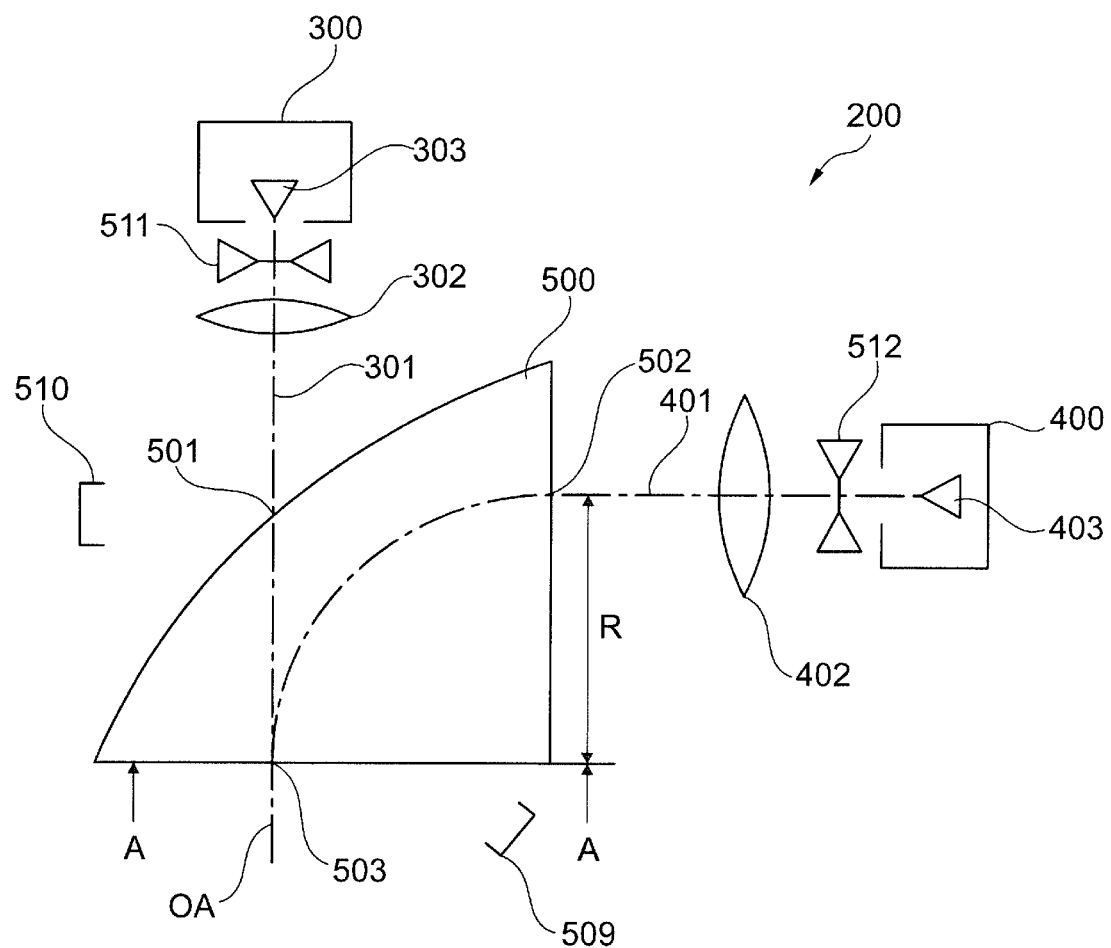
FIG. 4 shows a schematic representation of a second embodiment of a particle generator unit of the particle beam device.

FIG. 4 shows a schematic view of a further embodiment of the particle generator unit 200. FIG. 4 is based on FIG. 2. The same reference signs denote the same components of the particle generator unit 200. Therefore, the explanations above also apply. In addition to the components shown in FIG. 2, FIG. 4 shows a first beam stop unit 509 for stopping the first particle beam. In other words, the particle beam device 100 includes the first beam stop unit 509 which is used for stopping the first particle beam if the second particle beam is deflected by the deflection unit 500 and is guided along the optical axis OA to the objective lens 107. The deflection unit 500 may be configured in such a way that, when deflecting the second particle beam from the second generator beam axis 401 to the optical axis OA, the first particle beam is deflected by the deflection unit 500 to the first beam stop unit 509 for stopping the first particle beam. Additionally or alternatively the particle generator unit 200 may have a first movable beam stop unit 511 for stopping the first particle beam, wherein the first movable beam stop unit 511 may extend along the first generator beam axis 301. Moreover, the first movable beam stop unit 511 may be arranged between the first particle beam generator 300 and the deflection unit 500. The first movable beam stop unit 511 of this embodiment may be used for stopping the first particle beam if the second particle beam is deflected by the deflection unit 500 and is guided along the optical axis OA to the objective lens 107. In particular, the first movable beam stop unit 511 may be a valve. The valve may be configured to be closed if the first particle beam has to be stopped and may be configured to be opened if the first particle beam is guided along the optical axis OA to the objective lens 107.

In addition to the components shown in FIG. 2, FIG. 4 shows a second beam stop unit 510 for stopping the second particle beam. In other words, the particle beam device 100 may include the second beam stop unit 510 which is used for stopping the second particle beam if the first particle beam is guided along the optical axis OA to the objective lens 107. When the first particle beam is guided along the optical axis OA, the deflection unit 500 deflects neither the first particle beam nor the second particle beam. Therefore, the second particle beam is guided along the second generator beam axis 401 to the second beam stop unit 510 for stopping the second particle beam. Additionally or alternatively the particle generator unit 200 has a second movable beam stop unit 512 for stopping the second particle beam, wherein the second movable beam stop unit 512 may extend along the second generator beam axis 401. Moreover, the second movable beam stop unit 512 may be arranged between the second particle beam generator 400 and the deflection unit 500. The second movable beam stop unit 512 may be used for stopping the second particle beam if the first particle beam is guided along the optical axis OA to the objective lens 107. In particular, the second movable beam stop unit 512 may be a valve. The valve may be configured to be closed if the second particle beam has to be stopped and may be configured to be opened if the second particle beam is guided from the second generator beam axis 401 to the optical axis OA as well as along the optical axis OA in the direction of the objective lens 107.

Figure 5:
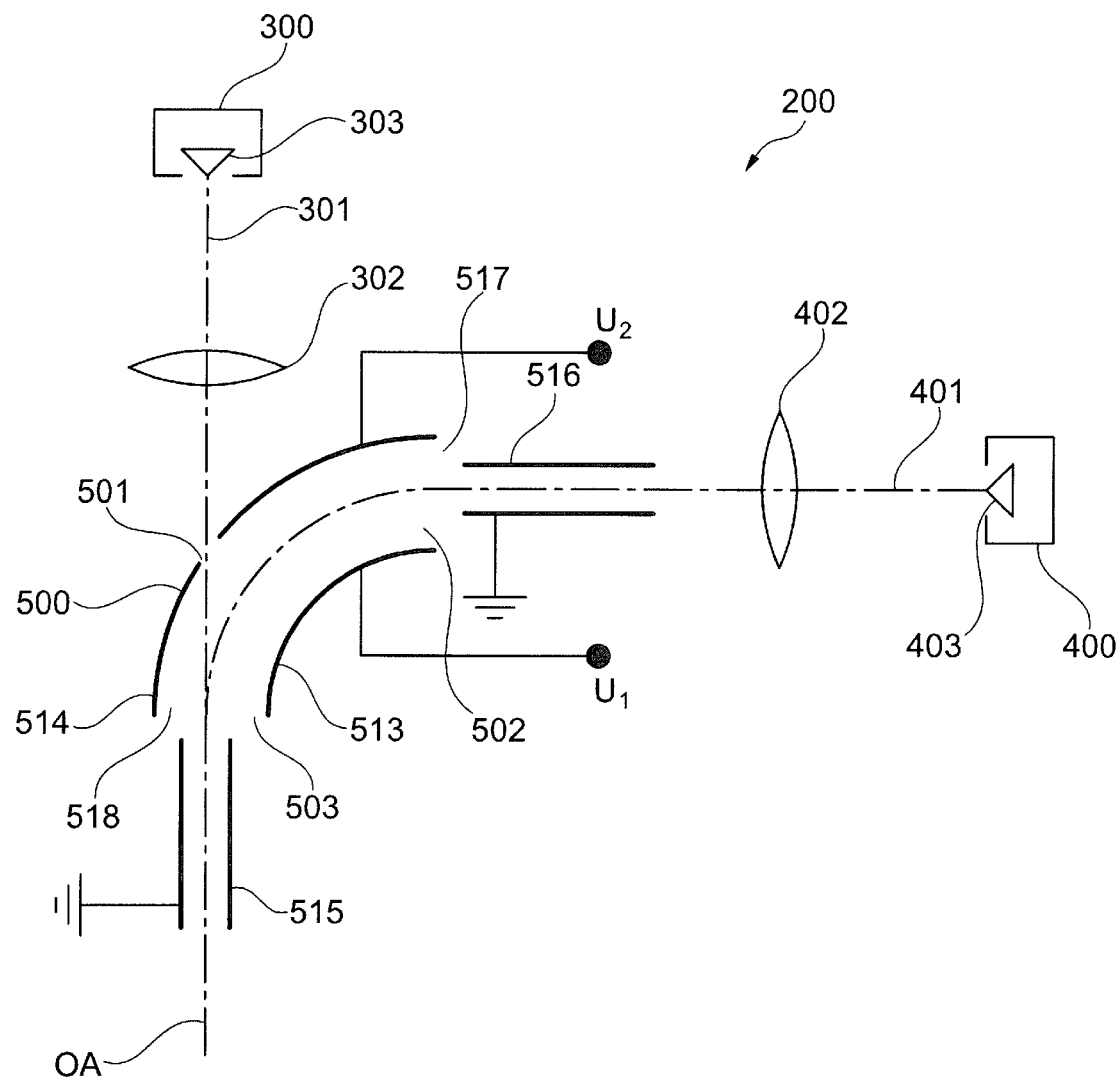
FIG. 5 shows a schematic representation of a third embodiment of a particle generator unit of the particle beam device.

FIG. 5 shows a schematic view of a further embodiment of the particle generator unit 200 of FIG. 1. The same reference signs denote the same components of the particle generator unit 200. Therefore, the explanations above also apply. In addition to the components shown in FIG. 1, FIG. 5 shows the deflection unit 500 being an electrostatic deflection unit providing an electric field. In particular, the deflection unit 500 may include a first deflection electrode 513 and a second deflection electrode 514 arranged opposite the first deflection electrode 513. The deflection unit 500 may be a spherical capacitor. Moreover, the deflection unit 500 may include an entrance side 517 and an exit side 518. The entrance side 517 may be directed to the second beam generator 400. The second beam generator 400 may be arranged at the entrance side 517. The exit side 518 is directed to the objective lens 107 (not shown in FIG. 5). A first grounded shield tube 516 is arranged at the entrance side 517 and extends along the second generator beam axis 401. A second grounded shield tube 515 is arranged at the exit side 518 and extends along the optical axis OA. The grounded shield tubes 515, 516 are configured to limit a fringing field of the deflection unit 500 in the form of the electrostatic deflection unit.

A voltage $U_1$ at the first deflection electrode 513 may be given by $$U_1 = 2 \cdot U \cdot \left(1 - \frac{R}{R_1}\right)$$

wherein $R_1$ is a radius of the first deflection electrode 513, U is the acceleration voltage of the second charged particles of the second particle beam and R is the deflection radius. Moreover, a voltage $U_2$ at the second deflection electrode 514 may be given by $$U_2 = 2 \cdot U \cdot \left(1 - \frac{R}{R_2}\right)$$

wherein $R_2$ is a radius of the second deflection electrode 514, U is the acceleration voltage of the second charged particles of the second particle beam and R is the deflection radius. For example, when U=2 kV, R=50 mm, $R_1$=45 mm and $R_2$=55 mm, then $U_1$=−444 V and $U_2$=364 V.

Figure 6:
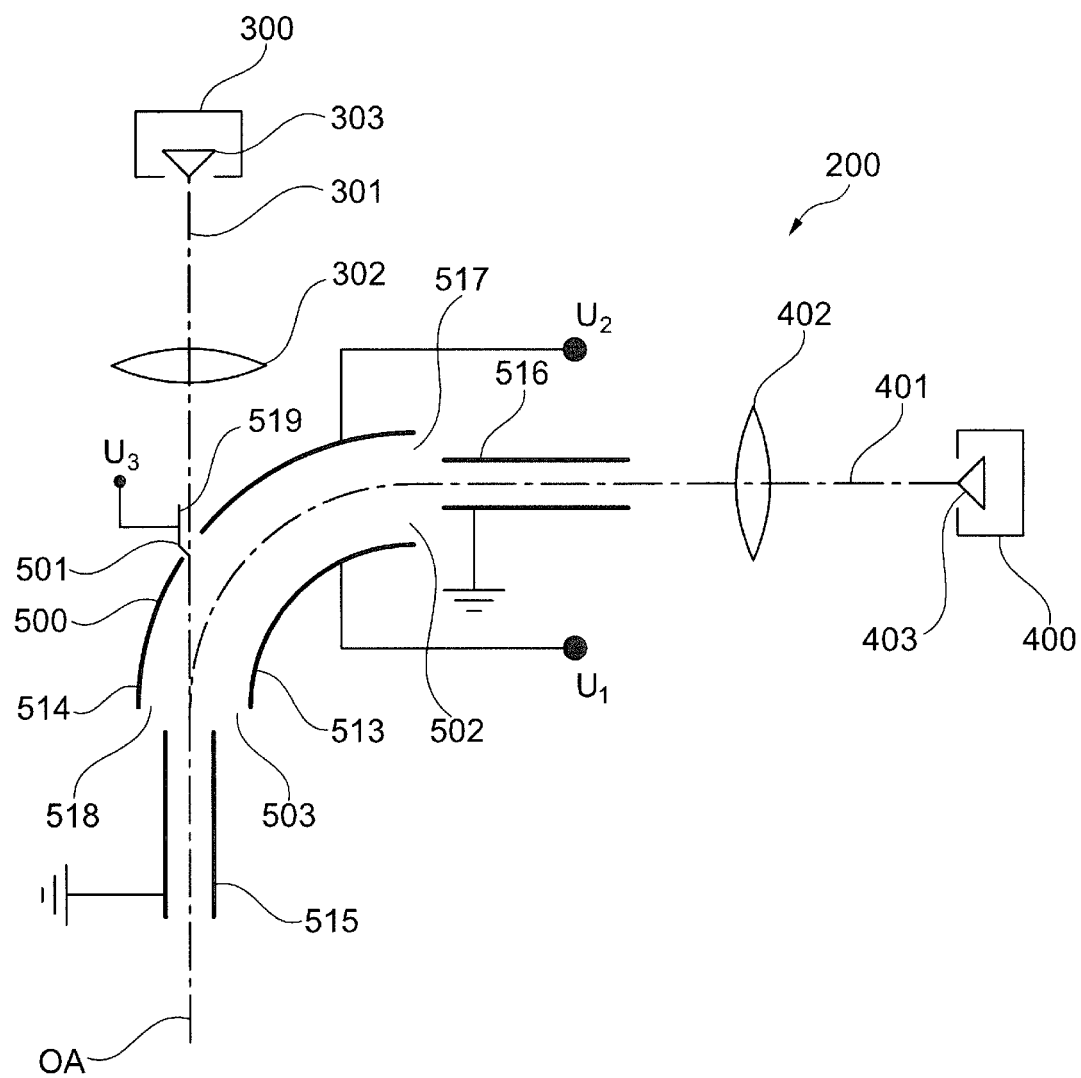
FIG. 6 shows a schematic representation of a fourth embodiment of a particle generator unit of the particle beam device.

FIG. 6 shows a schematic view of another embodiment of the particle generator unit 200. FIG. 6 is based on FIG. 5. The same reference signs denote the same components of the particle generator unit 200. Therefore, the explanations above also apply. In addition to the components shown in FIG. 5, FIG. 6 shows an electrode 519 for compensating the electric field in the deflection unit 500 in the form of the electrostatic deflection unit. Since the first opening 501 in the deflection unit 500 influences the electric field in the deflection unit 500, a compensation of the electric field is desirable. Therefore, this embodiment of the particle beam device 100 provides the electrode 519 for compensating the electric field. The electrode 519 may be arranged at the first opening 501, a voltage $U_3$ may be applied to the electrode 519 and the electrode 519 may be separated from the deflection unit 500 in a distance of, for example, 2 mm to 10 mm, wherein the boundaries are included in the range. The distance may be given by the distance of the center of the electrode 519 to an edge of the second deflection electrode 514. The invention is not restricted to the aforementioned range. Rather, any distance may be chosen which is suitable for the invention. Additionally or alternatively, the electrode 519 may be curved and may be rather close to the edge of the second deflection electrode 514. The voltage $U_3$ may be given by $$U_3 = k \cdot \left(\frac{DI \cdot U_2}{(R_2 - R)}\right) + U_2$$

wherein k is a given factor between 0.5 and 2, wherein the boundaries are included in this range, and wherein DI is the distance of the electrode 519 to the deflection unit 500. All further variables are explained above.

Figure 7:
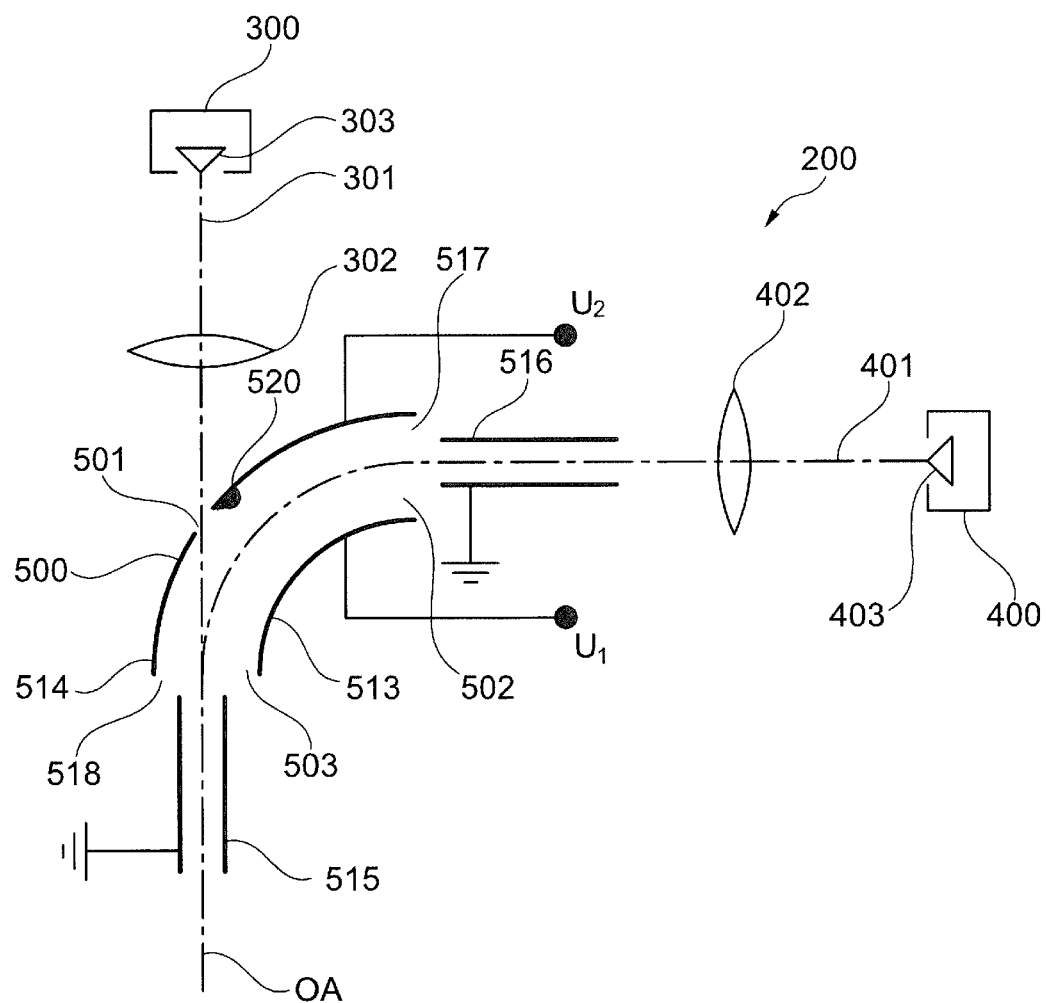
FIG. 7 shows a schematic representation of a fifth embodiment of a particle generator unit of the particle beam device.

FIG. 7 shows a schematic view of an embodiment of the particle generator unit 200. FIG. 7 is based on FIG. 5. The same reference signs denote the same components of the particle generator unit 200. Therefore, the explanations above also apply. In addition to the components shown in FIG. 5, FIG. 7 shows a deformation 520 of the second deflection electrode 514 for compensating the electric field in the deflection unit 500 in the form of the electrostatic deflection unit. The deformation 520 is arranged at an edge of the first opening 501 of the deflection unit 500. Since the first opening 501 in the deflection unit 500 influences the electric field in the deflection unit 500, a mechanism for compensating the electric field is desirable. Therefore, this embodiment includes the deformation 520 for compensating the electric field.

Figure 8:
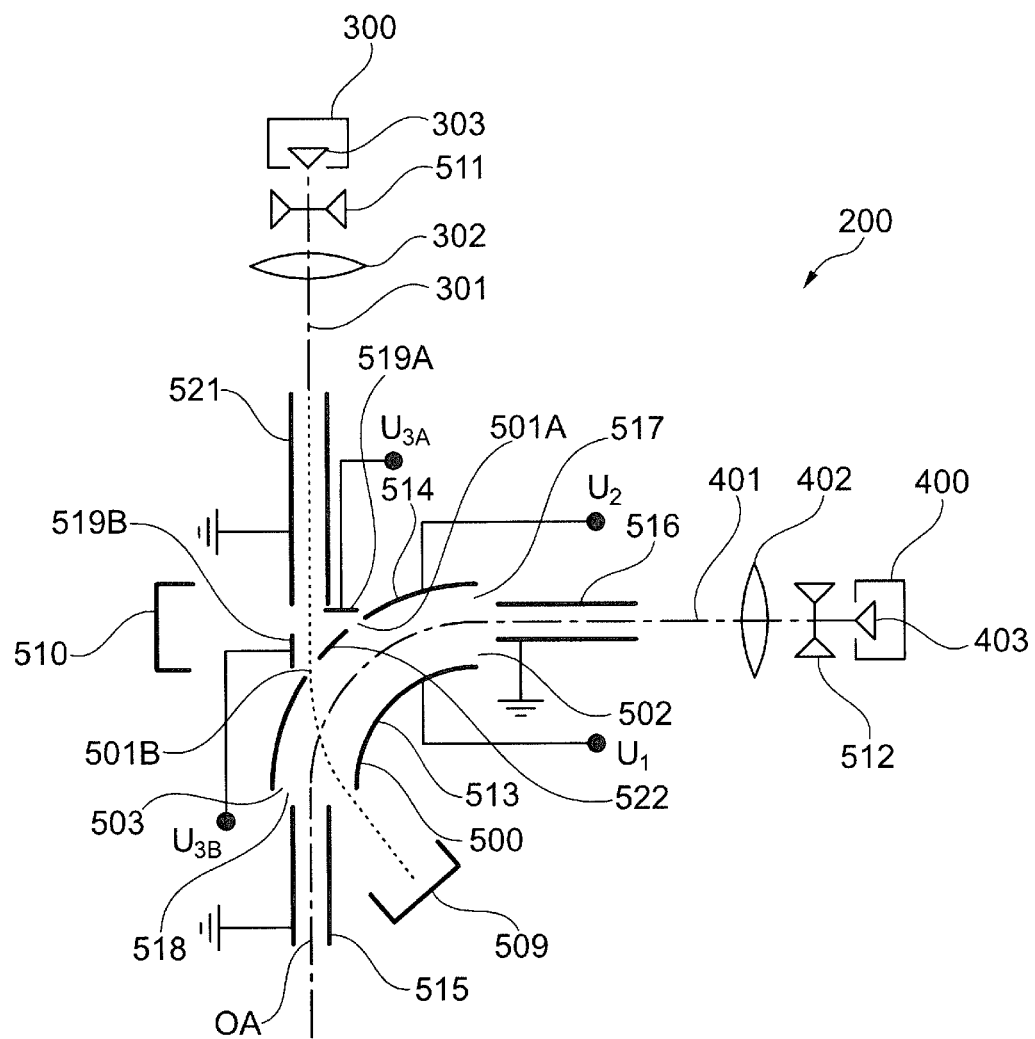
FIG. 8 shows a schematic representation of a sixth embodiment of a particle generator unit of the particle beam device.

FIG. 8 shows a schematic view of a further embodiment of the particle generator unit 200. FIG. 8 is based on FIG. 6. The same reference signs denote the same components of the particle generator unit 200. Therefore, the explanations above also apply. Instead of having a single first opening, the deflection unit 500 in the form of the electrostatic deflection unit shown in FIG. 8 has a first opening including a first opening part 501A and a second opening part 501B.

Additionally, the first opening part 501A and the second opening part 501B may be symmetrical. The first opening part 501A is connected to the second opening part 501B by a bridge 522. The bridge 522 is part of the deflection unit 500. A first electrode 519A for compensating the electric field may be arranged at the first opening part 501A, whereas a second electrode 519B for compensating the electric field may be arranged at the second opening part 501B. The first electrode 519A for compensating the electric field may be arranged between the deflection unit 500 and the first particle beam generator 300, a voltage $U_{3A}$ may be applied to the first electrode 519A for compensating the electric field and the first electrode 519A for compensating the electric field may be separated from the deflection unit 500 in a distance of, for example, 2 mm to 10 mm, wherein the boundaries are included in the range. The distance may be given by the distance of the center of the first electrode 519A to an edge of the second deflection electrode 514. The invention is not restricted to the aforementioned range. Rather, any distance may be chosen which is suitable for the invention. Additionally or alternatively, the first electrode 519A may be curved and may be rather close to the edge of the second deflection electrode 514. The voltage $U_{3A}$ may be given by $$U_{3A} = k \cdot \left(\frac{DI \cdot U_2}{(R_2 - R)}\right) + U_2$$

wherein k is a given factor between 0.5 and 2, wherein the boundaries are included in this range, and wherein DI is the distance of the first electrode 519A to the deflection unit 500. All further variables are explained above. Moreover, the second electrode 519B for compensating the electric field may be arranged between the deflection unit 500 and the first particle beam generator 300, a voltage $U_{3B}$ may be applied to the second electrode 519B for compensating the electric field and the second electrode 519B for compensating the electric field may also be separated from the deflection unit 500 in a distance of, for example, 2 mm to 10 mm, wherein the boundaries are included in the range. The distance may be given by the distance of the center of the second electrode 519B to an edge of the second deflection electrode 514. The invention is not restricted to the aforementioned range. Rather, any distance may be chosen which is suitable for the invention. Additionally or alternatively, the second electrode 519B may be curved and may be rather close to the edge of the second deflection electrode 514. The voltage $U_{3B}$ may be given by $$U_{3B} = k \cdot \left(\frac{DI \cdot U_2}{(R_2 - R)}\right) + U_2$$

wherein k is a given factor between 0.5 and 2, wherein the boundaries are included in this range, and wherein DI is the distance of the second electrode 519B to the deflection unit 500. All further variables are explained above.

FIG. 8 also shows a first beam stop unit 509 for stopping the first particle beam. In other words, the particle beam device 100 includes the first beam stop unit 509 which is used for stopping the first particle beam if the second particle beam is deflected by the deflection unit 500 and is guided along the optical axis OA to the objective lens 107. The deflection unit 500 may be configured in such a way that, when deflecting the second particle beam from the second generator beam axis 401 to the optical axis OA, the first particle beam is deflected by the deflection unit 500 to the first beam stop unit 509 for stopping the first particle beam. Additionally or alternatively the particle beam device 100 may have a first movable beam stop unit 511 for stopping the first particle beam, wherein the first movable beam stop unit 511 may extend along the first generator beam axis 301.

Moreover, the first movable beam stop unit 511 may be arranged between the first particle beam generator 300 and the deflection unit 500. The first movable beam stop unit 511 of this embodiment may be used for stopping the first particle beam if the second particle beam is deflected by the deflection unit 500 and is guided along the optical axis OA to the objective lens 107. In particular, the first movable beam stop unit 511 may be a valve. The valve may be configured to be closed if the first particle beam has to be stopped and may be configured to be opened if the first particle beam is guided along the optical axis OA to the objective lens 107.

FIG. 8 also shows a third grounded shield tube 521 that extends along the first generator beam axis 301 and is arranged at the first opening part 501A and at the second opening part 501B. If the second particle beam is deflected by the deflection unit 500 and is guided along the optical axis OA to the objective lens 107, the third grounded shield tube 521 largely reduces the influence from the first electrode 519A and the second electrode 519B as well as the influence from the fringing field of the first deflection electrode 513 and the second deflection electrode 514 to the course of the axis of the first particle beam, so that its beam guidance to the first beam stop unit 509 is improved.

FIG. 8 also shows a second beam stop unit 510 for stopping the second particle beam. In other words, the particle beam device 100 may include the second beam stop unit 510 which is used for stopping the second particle beam if the first particle beam is guided along the optical axis OA to the objective lens 107. When the first particle beam is guided along the optical axis OA, the deflection unit 500 deflects neither the first particle beam nor the second particle beam. Therefore, the second particle beam is guided along the second generator beam axis 401 to the second beam stop unit 510 for stopping the second particle beam. Additionally or alternatively the particle beam device 100 has a second movable beam stop unit 512 for stopping the second particle beam, wherein the second movable beam stop unit 512 may extend along the second generator beam axis 401. Moreover, the second movable beam stop unit 512 may be arranged between the second particle beam generator 400 and the deflection unit 500. The second movable beam stop unit 512 may be used for stopping the second particle beam if the first particle beam is guided along the optical axis OA to the objective lens 107. In particular, the second movable beam stop unit 512 may be a valve. The valve may be configured to be closed if the second particle beam has to be stopped and may be configured to be opened if the second particle beam is guided from the second generator beam axis 401 to the optical axis OA as well as along the optical axis OA in the direction of the objective lens 107.

Figure 9:
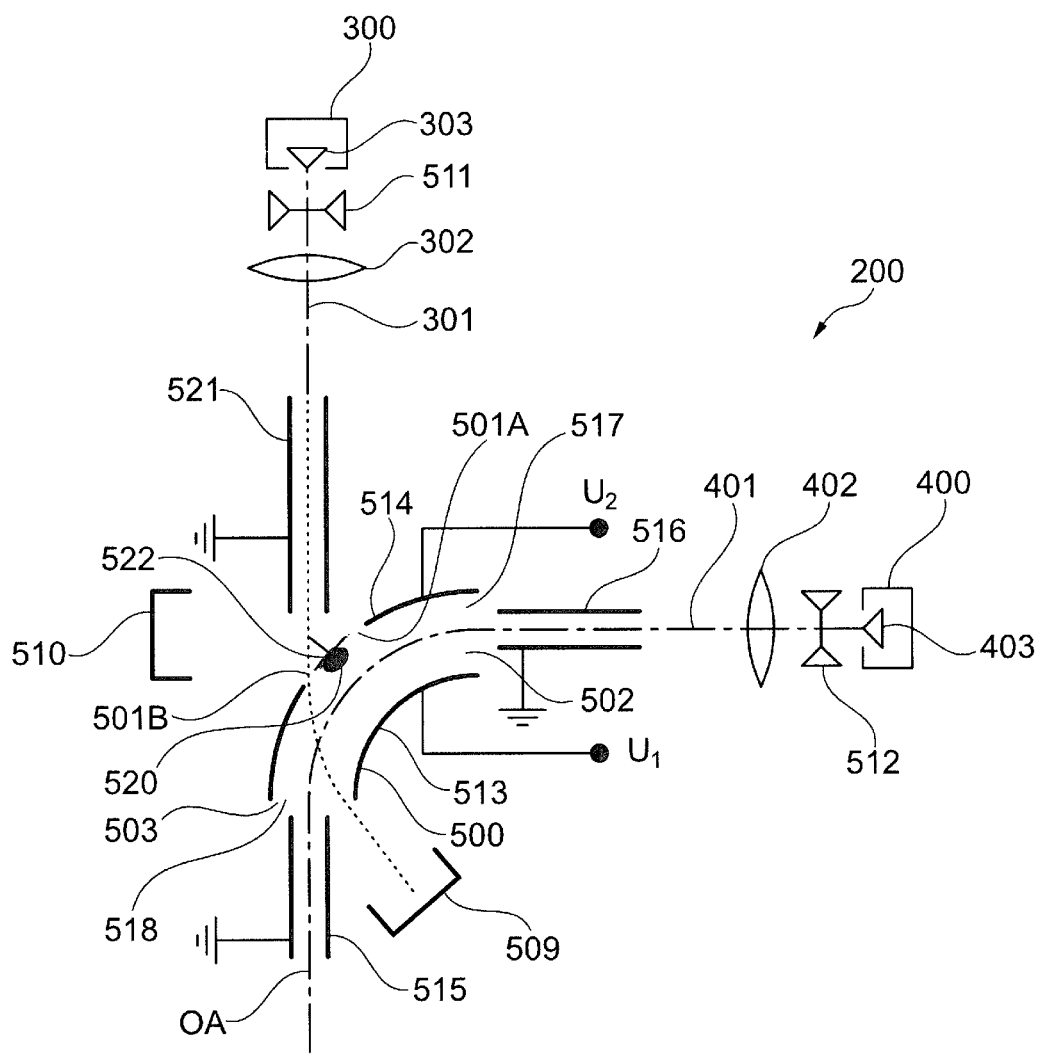
FIG. 9 shows a schematic representation of a seventh embodiment of a particle generator unit of the particle beam device.

FIG. 9 shows a schematic view of another embodiment of the particle generator unit 200. FIG. 9 is based on FIG. 8. The same reference signs denote the same components of the particle generator unit 200. Therefore, explanations above also apply to the embodiment of FIG. 9. However, instead of having a first electrode 519A for compensating the electric field and a second electrode 519B for compensating the electric field, a deformation 520 for compensating the electric field in the deflection unit 500 is arranged at the bridge 522.

The particle beam device 100 provides for selecting the first particle beam having the first charged particles or the second particle beam having the second charged particles. Moreover, the particle beam device 100 provides for deflecting the second particle beam having the second charged particles from the second generator beam axis 401 to the optical axis OA and along the optical axis OA for guiding the second particle beam to the objective lens 107. Additionally, the particle beam device 100 is configured to focus the second particle beam having the second charged particles in a plane of deflection which is identical to focusing the second particle beam in a further plane at each point of the optical axis OA, wherein the further plane is perpendicular to the plane of deflection. Therefore, a stigmatic imaging of the object may be provided. Additionally, the particle beam device 100 provides for the first particle beam to pass the deflection unit 500 if the first particle beam is selected, wherein the first particle beam is not deflected by the deflection unit 500.

Other embodiments of the invention will be apparent to those skilled in the art from a consideration of the specification and/or an attempt to put into practice the invention disclosed herein. It is intended that the specification and examples be considered as exemplary only, with the true scope and spirit of the invention being indicated by the following claims.

The invention claimed is:
1. A particle beam device for imaging, analyzing and/or processing an object, comprising:
   an optical axis;
   a first particle beam generator that generates a first particle beam having first charged particles, wherein the first particle beam generator has a first generator beam axis, wherein the optical axis and the first generator beam axis are identical;
   a second particle beam generator that generates a second particle beam having second charged particles, wherein the second particle beam generator has a second generator beam axis, wherein the optical axis and the second generator beam axis are arranged at an angle being different from 0° and 180°;
   a deflection unit that deflects the second charged particles from the second generator beam axis to the optical axis and along the optical axis, the deflection unit configured to have a first operation mode in which the first charged particles of the first particle beam are guided along the optical axis without being deflected by the deflection unit and the deflection unit configured to have a second operation mode in which the second charged particles of the second particle beam are deflected by the deflection unit from the second generator beam axis to the optical axis and are guided further along the optical axis and the deflection unit configured to operate in one of the first operation mode or the second operation mode, wherein the deflection unit has a first opening and a second opening being different from the first opening, wherein the optical axis runs through the first opening, wherein the second generator beam axis runs through the second opening;
   at least one objective lens that focuses the first particle beam or the second particle beam onto the object, wherein the optical axis runs through the objective lens; and
   at least one detector that detects interaction particles and/or interaction radiation, the interaction particles and the interaction radiation being generated when the first particle beam or the second particle beam impinges on the object.

2. The particle beam device according to claim 1, further comprising at least one of the following:
   the first particle beam generator being a liquid metal ion source;
   the second particle beam generator being a plasma ion source.

3. The particle beam device according to claim 1, further comprising at least one of the following:
   the first particle beam generator being a gallium liquid metal ion source;
   the second particle beam generator being a noble gas plasma ion source;
   the second particle beam generator being an argon plasma ion source.

4. The particle beam device according to claim 1, further comprising one of the following:
   the first particle beam generator being a cold field emission source and the second particle beam generator being a thermionic source;
   the first particle beam generator being an electron source and the second particle beam generator being an ion source;
   the first particle beam generator being an ion source and the second particle beam generator being an electron source;
   the first particle beam generator being a first ion source and the second particle beam generator being a second ion source.

5. The particle beam device according to claim 1, further comprising at least one of the following:
   a first generator condenser lens extending along the first generator beam axis, wherein the first generator condenser lens is arranged between the first particle beam generator and the deflection unit;
   a second generator condenser lens extending along the second generator beam axis, wherein the second generator condenser lens is arranged between the second particle beam generator and the deflection unit.

6. The particle beam device according to claim 1, further comprising:
   a beam limiting aperture unit arranged along the optical axis between the deflection unit and the objective lens.

7. The particle beam device according to claim 1, further comprising one of the following:
   a first beam stop unit that stops the first particle beam;
   a first movable beam stop unit that stops the first particle beam, wherein the first movable beam stop unit extends along the first generator beam axis and wherein the first movable beam stop unit is arranged between the first particle beam generator and the deflection unit.

8. The particle beam device according to claim 1, further comprising one of the following:
   a second beam stop unit that stops the second particle beam;
   a second movable beam stop unit that stops the second particle beam, wherein the second movable beam stop unit extends along the second generator beam axis and wherein the second movable beam stop unit is arranged between the second particle beam generator and the deflection unit.

9. The particle beam device according to claim 1, wherein the deflection unit is a magnetic deflection unit providing a non-homogeneous magnetic field.

10. The particle beam device according to claim 1, wherein the particle beam device is at least one of the following: an electron beam device and an ion beam device.

11. A particle beam device for imaging, analyzing and/or processing an object, comprising:
    an optical axis;
    a first particle beam generator that generates a first particle beam having first charged particles, wherein the first particle beam generator has a first generator beam axis, wherein the optical axis and the first generator beam axis are identical;
a second particle beam generator that generates a second particle beam having second charged particles, wherein the second particle beam generator has a second generator beam axis, wherein the optical axis and the second generator beam axis are arranged at an angle being different from 0° and 180°;
a deflection unit that deflects the second charged particles from the second generator beam axis to the optical axis and along the optical axis, wherein the deflection unit has a first opening and a second opening being different from the first opening, wherein the optical axis runs through the first opening, wherein the second generator beam axis runs through the second opening;
at least one objective lens that focuses the first particle beam or the second particle beam onto the object, wherein the optical axis runs through the objective lens; and
at least one detector that detects interaction particles and/or interaction radiation, the interaction particles and the interaction radiation being generated when the first particle beam or the second particle beam impinges on the object, wherein the deflection unit is a magnetic deflection unit providing a non-homogeneous magnetic field and wherein the deflection unit has a first pole piece and a second pole piece arranged opposite the first pole piece, wherein a cone-shaped opening having a half cone angle is arranged between the first pole piece and the second pole piece, wherein the optical axis runs through the cone-shaped opening and wherein the first pole piece and the second pole piece have a yoke that includes a coil arranged at the yoke.

12. A particle beam device for imaging, analyzing and/or processing an object, comprising:
an optical axis;
a first particle beam generator that generates a first particle beam having first charged particles, wherein the first particle beam generator has a first generator beam axis, wherein the optical axis and the first generator beam axis are identical;
a second particle beam generator that generates a second particle beam having second charged particles, wherein the second particle beam generator has a second generator beam axis, wherein the optical axis and the second generator beam axis are arranged at an angle being different from 0° and 180°;
a deflection unit that deflects the second charged particles from the second generator beam axis to the optical axis and along the optical axis, wherein the deflection unit has a first opening and a second opening being different from the first opening, wherein the optical axis runs through the first opening, wherein the second generator beam axis runs through the second opening;
at least one objective lens that focuses the first particle beam or the second particle beam onto the object, wherein the optical axis runs through the objective lens; and
at least one detector that detects interaction particles and/or interaction radiation, the interaction particles and the interaction radiation being generated when the first particle beam or the second particle beam impinges on the object, wherein the deflection unit is an electrostatic deflection unit providing an electric field.

13. The particle beam device according to claim 12, further comprising at least one of the following:
the electrostatic deflection unit includes a first deflection electrode and a second deflection electrode arranged opposite the first deflection electrode;
the electrostatic deflection unit includes a spherical capacitor;
the electrostatic deflection unit includes an entrance side and an exit side, wherein a first grounded shield tube is arranged at the entrance side and wherein a second grounded shield tube is arranged at the exit side.

14. The particle beam device according to claim 12, further comprising one of the following:
an electrode that compensates the electric field, wherein the electrode is arranged at the first opening and wherein the electrode is separated from the deflection unit;
the first opening includes a first opening part and a second opening part, wherein the first opening part is connected to the second opening part by a bridge being part of the deflection unit and wherein an electrode that compensates the electric field is arranged at the first opening part and/or at the second opening part of the first opening, the electrode being separated from the deflection unit;
the first opening includes a first opening part and a second opening part, wherein the first opening part is connected to the second opening part by a bridge that is part of the deflection unit, wherein the first opening part and the second opening part are symmetrical, wherein an electrode that compensates the electric field is arranged at the first opening part and/or at the second opening part of the first opening, the electrode being separated from the deflection unit.

15. The particle beam device according to claim 12, further comprising one of the following:
at least one deformation that compensates the electric field arranged at the first opening;
at least one deformation that compensates the electric field arranged at the first opening, wherein the at least one deformation is arranged at an edge of the first opening of the deflection unit;
the first opening includes a first opening part and a second opening part, wherein the first opening part is connected to the second opening part by a bridge that is part of the deflection unit and wherein at least one deformation that compensates the electric field is arranged at the bridge;
the first opening includes a first opening part and a second opening part, wherein the first opening part is connected to the second opening part by a bridge that is part of the deflection unit, wherein the first opening part and the second opening part are symmetrical, and wherein at least one deformation that compensates the electric field is arranged at the bridge.

* * * * *